United States Patent
Shin et al.

(10) Patent No.: US 10,986,731 B2
(45) Date of Patent: Apr. 20, 2021

(54) DISPLAY DEVICE

(71) Applicant: Samsung Display Co., Ltd., Yongin-Si (KR)

(72) Inventors: Jaiku Shin, Hwaseong-si (KR); Hansun Ryou, Seoul (KR); Sung Chul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/719,167

(22) Filed: Dec. 18, 2019

(65) Prior Publication Data

US 2020/0274098 A1   Aug. 27, 2020

(30) Foreign Application Priority Data

Feb. 22, 2019   (KR) .................. 10-2019-0021370

(51) Int. Cl.
| | |
|---|---|
| *H05K 1/02* | (2006.01) |
| *H05K 1/14* | (2006.01) |
| *H05K 1/18* | (2006.01) |
| *H05K 1/11* | (2006.01) |
| *G06F 3/044* | (2006.01) |

(52) U.S. Cl.
CPC ............ *H05K 1/147* (2013.01); *H05K 1/028* (2013.01); *H05K 1/0281* (2013.01); *H05K 1/118* (2013.01); *H05K 1/18* (2013.01); *G06F 3/044* (2013.01); *G06F 2203/04102* (2013.01); *H01L 2251/5338* (2013.01); *H05K 2201/10128* (2013.01)

(58) Field of Classification Search
CPC .... H05K 1/028; H05K 1/0281; H05K 1/0277; H05K 1/18; H05K 1/118; H05K 1/147; H05K 1/189; H05K 2201/10218; H05K 7/20954
See application file for complete search history.

(56) References Cited

U.S. PATENT DOCUMENTS

| | | | | |
|---|---|---|---|---|
| 9,506,279 | B2* | 11/2016 | Kauhaniemi | ............. E05D 1/04 |
| 9,661,719 | B2 | 5/2017 | Jang et al. | |
| 9,939,847 | B2 | 4/2018 | Kee et al. | |
| 10,043,421 | B2 | 8/2018 | Koo et al. | |
| 2012/0307423 | A1* | 12/2012 | Bohn | ..................... G06F 1/1652 |
| | | | | 361/679.01 |
| 2016/0118616 | A1* | 4/2016 | Hiroki | ................. H01L 51/0097 |
| | | | | 257/40 |
| 2016/0349878 | A1* | 12/2016 | Kim | ....................... H05K 1/028 |

FOREIGN PATENT DOCUMENTS

| | | |
|---|---|---|
| KR | 1020140142004 A | 12/2014 |
| KR | 1020160069560 A | 6/2016 |
| KR | 1020160090471 A | 8/2016 |
| KR | 1020170064453 A | 6/2017 |

* cited by examiner

*Primary Examiner* — Hoa C Nguyen
(74) *Attorney, Agent, or Firm* — Cantor Colburn LLP

(57) ABSTRACT

A display device includes a display module foldable with respect to a bending axis, an adhesive member which is disposed under the display module, a plurality of support members adhered to the adhesive member, and a crack preventing pattern layer adhered to a portion of the adhesive member, which overlaps the bending axis. The crack preventing pattern layer includes a plurality of crack preventing members spaced from each other. Each of the crack preventing members includes a metal or an inorganic material and is in contact with the adhesive member.

18 Claims, 15 Drawing Sheets

DISPLAY DEVICE

This application claims priority to Korean Patent Application No. 10-2019-0021370, filed on Feb. 22, 2019, and all the benefits accruing therefrom under 35 U.S.C. § 119, the content of which in its entirety is herein incorporated by reference.

BACKGROUND

1. Field

Embodiments of the invention described herein relate to a foldable display device, and more particularly, relate to a display device in which durability of a folding portion is improved.

2. Description of the Related Art

A display device displays various images in a display screen and provides information to a user. In general, the display device displays information on a screen defined therein.

Nowadays, a flexible display device including a bendable or flexible display device is being developed. Unlike a rigid flat display device, the flexible display device may be bendable, rollable, or foldable like a paper. The flexible display device that is variously variable in shape may be portable without restriction of an existing screen size, thus improving the convenience of user.

SUMMARY

A flexible display device, which is flexible, is desired to secure durability for enduring repetitive folding.

Embodiments of the invention provide a foldable display device capable of suppressing deformation of a folding portion due to repetitive folding.

An embodiment of a display device according to the invention includes a display module, an adhesive member, a first support member, a second support member, and a crack preventing pattern layer.

In such an embodiment, a first display area, a second display area, and a third display area interposed between the first display area and the second display area are defined in the display module, and the display module is foldable with respect to a bending axis overlapping the third display area.

In such an embodiment, the adhesive member is disposed under the display module and overlaps the first display area, the second display area, and the third display area.

In an embodiment, the first support member overlaps the first display area and is disposed under the adhesive member, and a portion of the first support member may be in contact with the adhesive member. In such an embodiment, the second support member overlaps the second display area, is disposed under the adhesive member, and spaced from the first support member with a predetermined distance. In such an embodiment, a portion of the second support member is in contact with the adhesive member.

In such an embodiment, the crack preventing pattern layer overlaps the third display area and is disposed under the adhesive member. In such an embodiment, the crack preventing pattern layer may include a plurality of crack preventing members, and each of the crack preventing members includes a metal or an inorganic material and is in contact with the adhesive member.

In an embodiment, a thickness of each of the crack preventing members may be in a range of about 0.5 micrometer (μm) to about 2 μm.

In an embodiment, a separation distance between a first crack preventing member and a second crack preventing member of the crack preventing members may be in a range of about 0.5 millimeter (mm) to about 1 mm, and the second crack preventing member is adjacent to the first crack preventing member.

In an embodiment, a first portion of the crack preventing pattern layer may be interposed between the first support member and the adhesive member, and a second portion of the crack preventing pattern layer may be interposed between the second support member and the adhesive member.

In an embodiment, a third portion of the crack preventing pattern layer may be interposed between the first portion and the second portion, and the third portion may be exposed by a separation space between the first support member and the second support member.

In an embodiment, the plurality of crack preventing members may be arranged in a form of a matrix.

In an embodiment, each of the plurality of crack preventing members extends in a direction parallel to a direction in which the bending axis extends.

In an embodiment, when the display device is in a first mode where the display module is not folded, the crack preventing pattern layer may be in contact with the first support member and the second support member. In such an embodiment, when the display device is in a second mode where the display module is folded with respect to the bending axis, the crack preventing pattern layer may be spaced from the first support member and the second support member.

In an embodiment, a first area by which the crack preventing pattern layer is in contact with the first support member and the second support member in a first mode where the display module is not folded may be greater than a second area by which the crack preventing pattern layer is in contact with the first support member and the second support member in a second mode where the display module is folded with respect to the bending axis.

In an embodiment, the first support member may overlap a first portion of the third display area and may not overlap the second display area, and the second support member may overlap a second portion of the third display area and may not overlap the first display area.

In an embodiment, the display module may include a display panel that includes a plurality of light-emitting elements and an encapsulation layer which encapsulates the plurality of light-emitting elements, and an input sensing circuit disposed on the display panel, where the input sensing circuit senses a variation in a capacitance by an object approaching from an outside.

In an embodiment, the input sensing circuit may be directly disposed on the encapsulation layer of the display panel.

In an embodiment, the display device may further include a printed circuit board electrically connected to the display module, and a driving circuit disposed on the printed circuit board. In such an embodiment, a portion of the display module may be bent and at least a portion of the display module, at least a portion of the printed circuit board, and the driving circuit may be disposed under the first support member or the second support member.

In an embodiment, the display device a may further include a shock absorbing member interposed between the display module and the first support member and between the display module and the second support member and having a predetermined elasticity.

An embodiment of a display device according to the invention includes a display module, an adhesive member, a first support member, a second support member, and a crack preventing pattern.

In such an embodiment, a first display area, a second display area, and a third display area interposed between the first display area and the second display area are defined in the display module, and the display module is foldable with respect to a bending axis overlapping the third display area.

In an embodiment, the adhesive member is disposed under the display module and includes a first adhesive part, a second adhesive part, and a third adhesive part interposed between the first adhesive part and the second adhesive part.

In an embodiment, the first support member overlaps the first display area and is disposed under the adhesive member, and a first portion of the first support member is in contact with the first adhesive part. In such an embodiment, the second support member overlaps the second display area and is disposed under the adhesive member, and a first portion of the second support member is in contact with the second adhesive part.

In an embodiment, the crack preventing pattern layer overlaps the third display area and is disposed under the adhesive member, and the crack preventing pattern layer includes a plurality of crack preventing members, where each of the crack preventing member includes a metal or an inorganic material and is in contact with the third adhesive part.

BRIEF DESCRIPTION OF THE FIGURES

The above and other features of the invention will become apparent by describing in detail exemplary embodiments thereof with reference to the accompanying drawings, in which.

DETAILED DESCRIPTION

Figure 1:
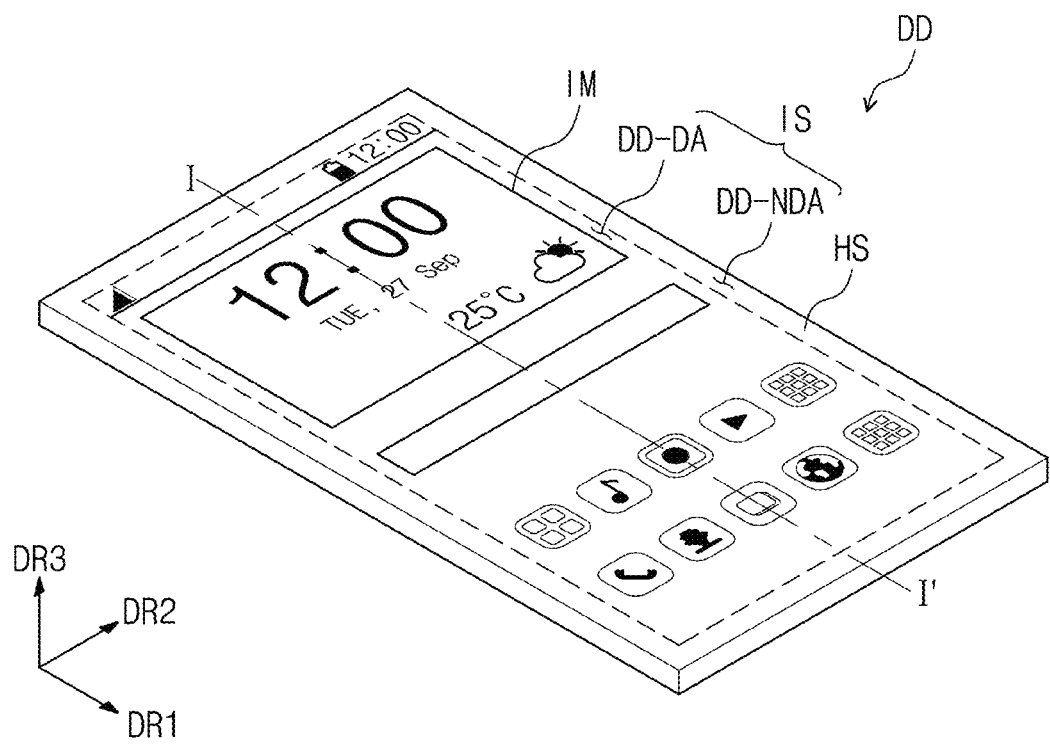
FIG. 1 is a cross-sectional view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one of A and B" means "A or B." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of a display device DD according to an embodiment of the invention. In an embodiment, as illustrated in FIG. 1, a display surface IS, in which an image IM is displayed, is parallel to a surface that is defined by a first direction DR1 and a second direction DR2. The normal direction of the display surface IS, that is, a thicknesses direction of the display device DD corresponds to a third direction DR3. A front surface (or an upper surface) and a rear surface (or a lower surface) of each member are surface facing the third direction DR3. However, directions that the first, second, and third directions DR1, DR2, and DR3 indicate may be a relative concept and may be changed to different directions. Herein, first to third directions that are directions respectively indicated by the first, second, and third directions DR1, DR2, and DR3 are marked by the same reference symbols.

An embodiment of the display device DD according to the invention may be a foldable display device. The display device DD may be used in a small and medium-sized electronic device, such as a mobile phone, a tablet, a vehicle navigation system, a game console, or a smart watch, as well as a large-sized electronic device, such as a television or a monitor.

In an embodiment, as illustrated in FIG. 1, the display surface IS of the display device DD may include or be divided into a plurality of areas. The display device DD includes a display area DD-DA where the image IM is displayed and a non-display area DD-NDA adjacent to the display area DD-DA. The non-display area DD-NDA is an area where an image is not displayed. Application icons and a clock window are illustrated in FIG. 1 as an example of the image IM. The display area DD-DA may be in the form of a rectangle. The non-display area DD-NDA may surround the display area DD-DA. However, the invention is not limited thereto. In such an embodiment, a shape of the display area DD-DA and a shape of the non-display area DD-NDA may be variously modified or designed to be relative to each other.

The display device DD may include a housing HS. The housing HS may define an outer surface of the display device DD and may accommodate parts therein.

FIGS. 2A to 2G are views illustrating how the display device DD illustrated in FIG. 1 is folded.

Figure 2A:
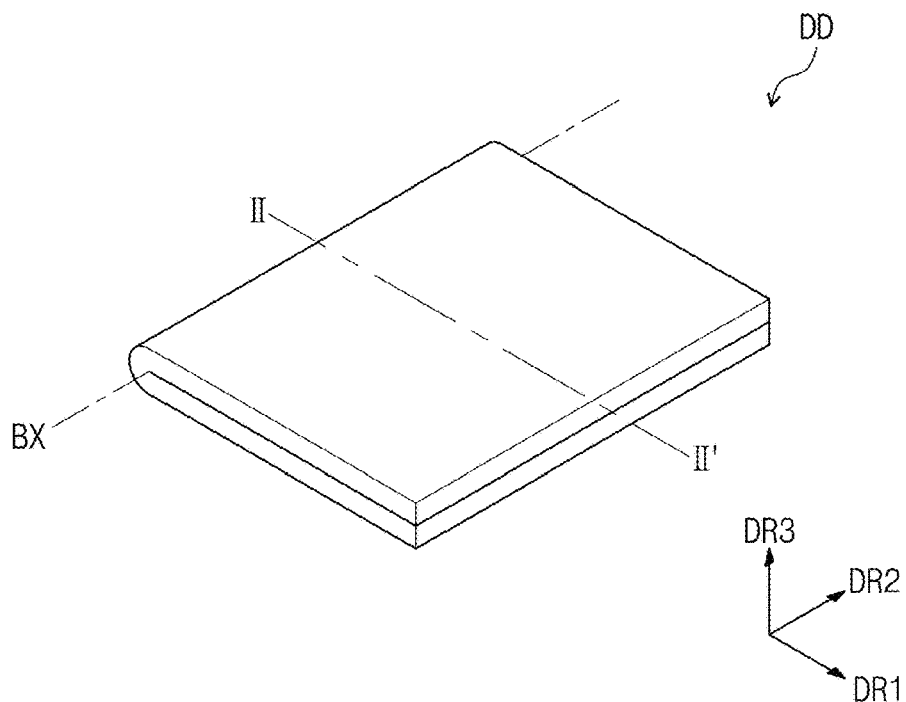
FIGS. 2A to 2G are views illustrating how a display device illustrated in FIG. 1 is folded.
Figure 2B:
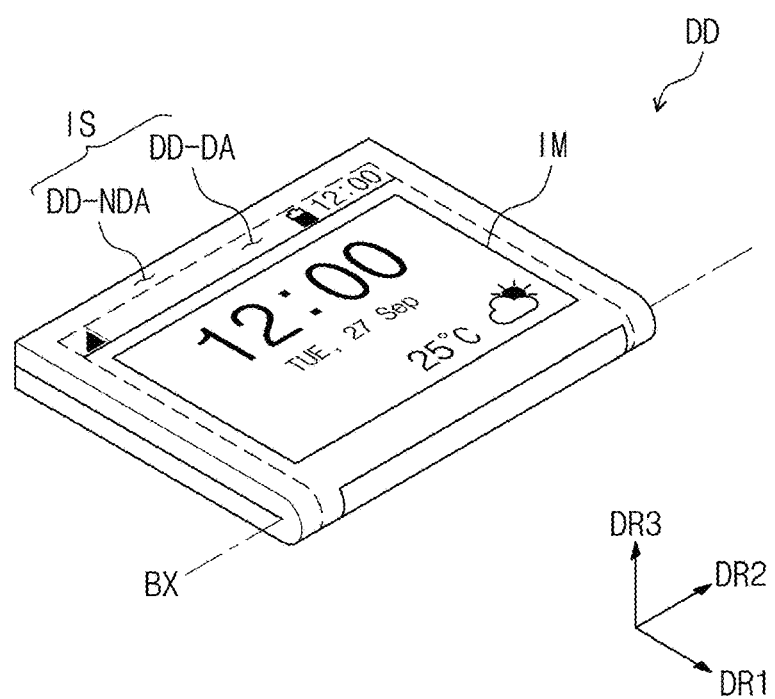
Figure 2C:
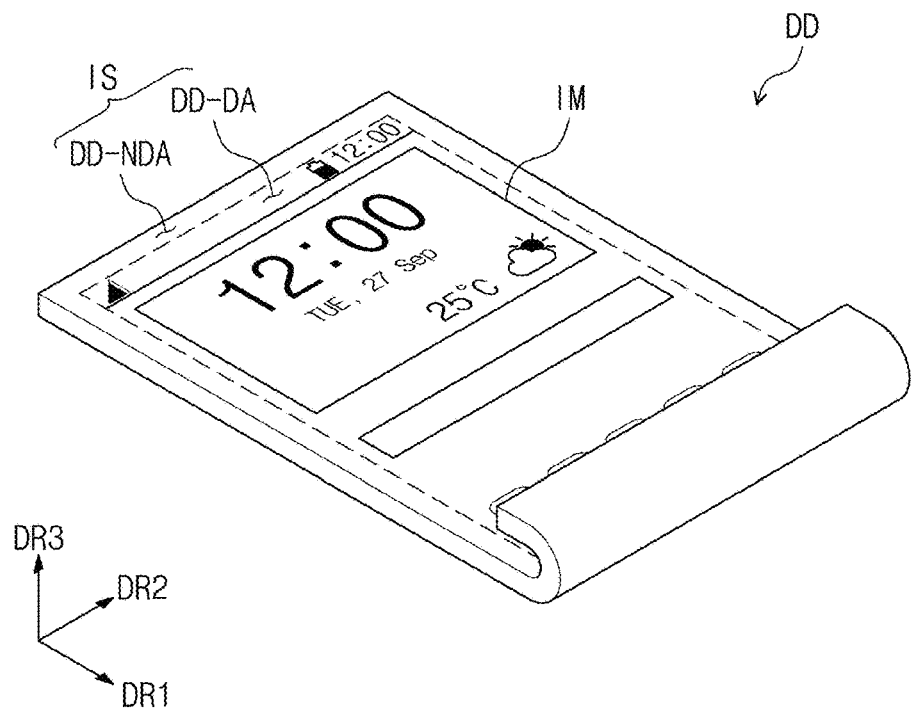
Figure 2D:
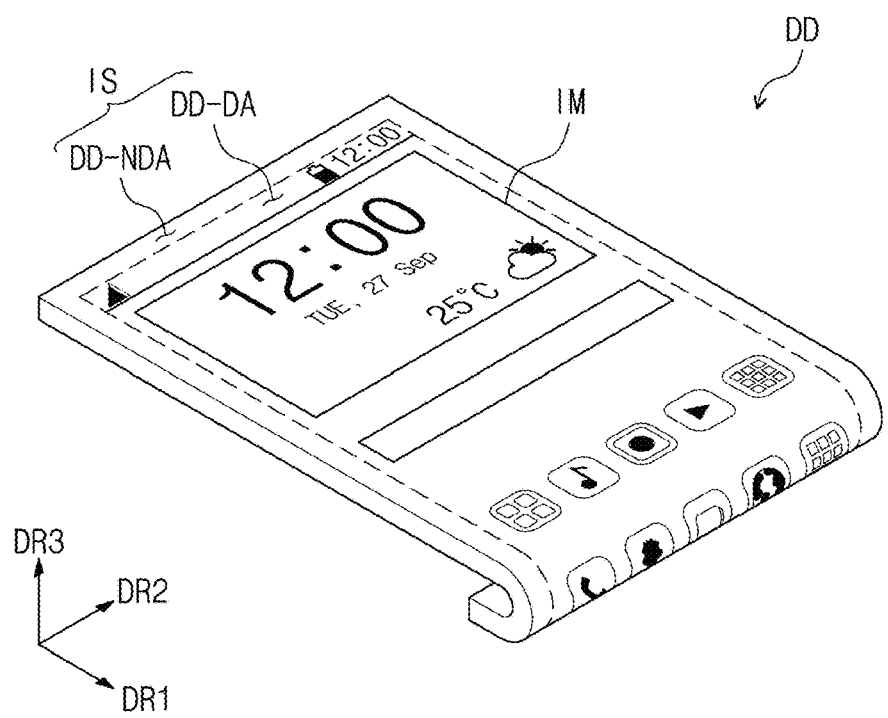
Figure 2E:
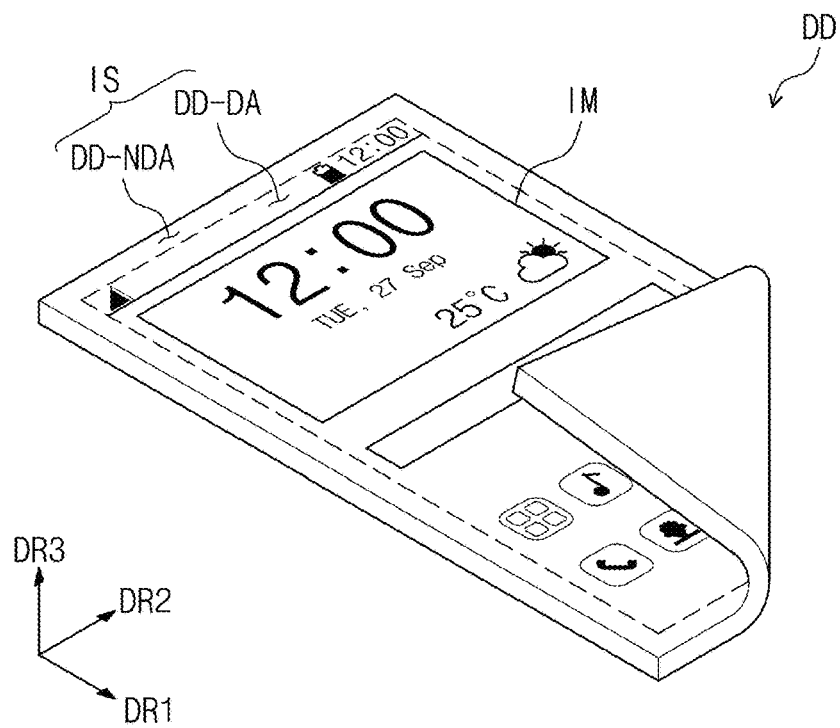

Referring to FIG. 2A, an embodiment of the display device DD according to the invention may be in-folded with respect to a bending axis BX that is parallel to the second direction DR2. Referring to FIG. 2B, an embodiment of the display device DD may be out-folded with respect to the bending axis BX that is parallel to the second direction DR2. Referring to FIG. 2C, an embodiment of the display device DD a may be folded inwardly from an end portion of the display device DD. Referring to FIG. 2D, an embodiment of the display device DD may be folded outwardly from the end portion of the display device DD. Referring to FIG. 2E, an embodiment of the display device DD may be folded in a diagonal direction.

Figure 2F:
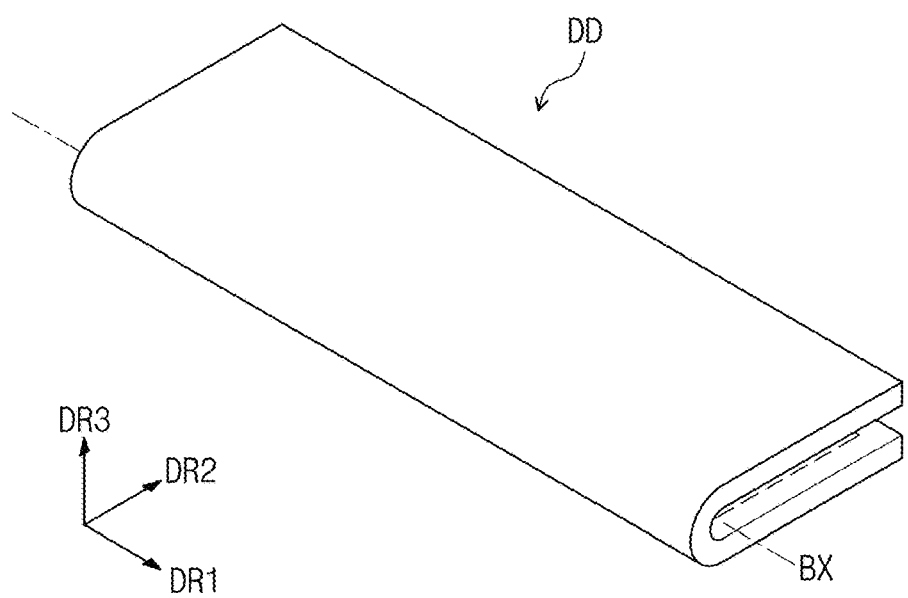
Figure 2G:
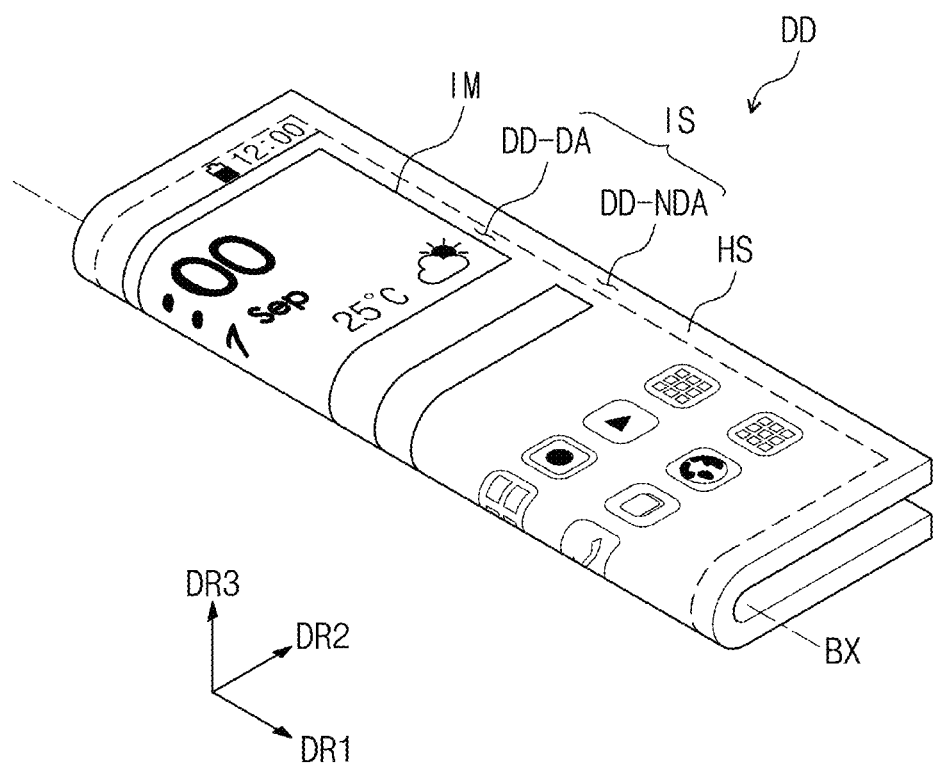

Referring to FIG. 2F, an embodiment of the display device DD may be in-folded with respect to the bending axis BX that is parallel to the first direction DR1. Referring to FIG. 2G, an embodiment of the display device DD may be out-folded with respect to the bending axis BX that is parallel to the first direction DR1.

In embodiments of the invention, as described above, the bending axis BX may be variously changed.

The various ways to fold the display device DD are illustrated in FIGS. 2A to 2G, but the invention is not limited thereto.

Figure 3:
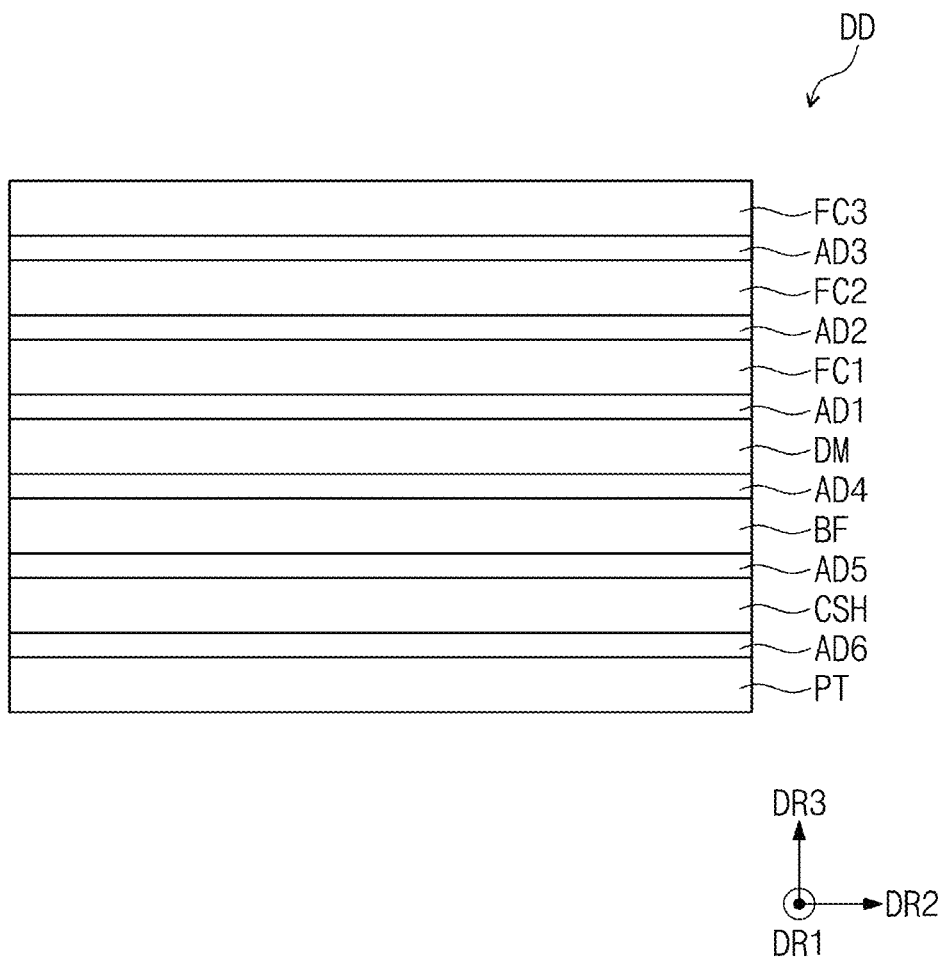
FIG. 3 illustrates a cross section of a portion of a display device according to an embodiment of the invention.
Figure 4A:
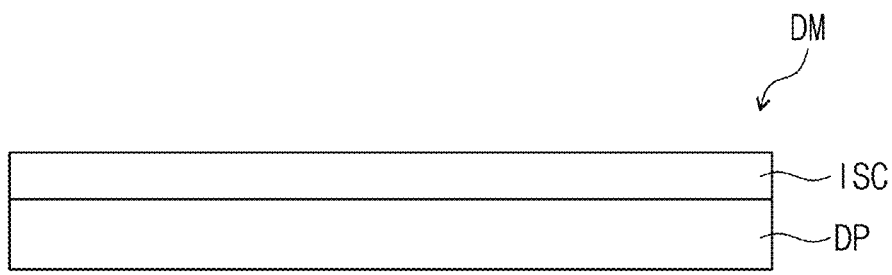
FIGS. 4A and 4B are cross-sectional views of a display module illustrated in FIG. 3.
Figure 4B:
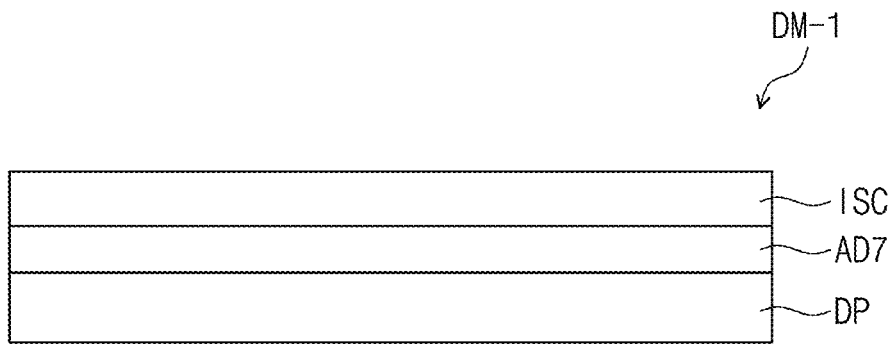

FIG. 3 illustrates a cross section of a portion of the display device DD according to an embodiment of the invention. FIG. 4A is a cross-sectional view of a display module DM of FIG. 3 according to an embodiment of the invention, and FIG. 4B is a cross-sectional view of a display module DM-1 according to an alternative embodiment of the invention. FIG. 3 shows a cross section defined by the second direction DR2 and the third direction DR3.

Figure 9A:
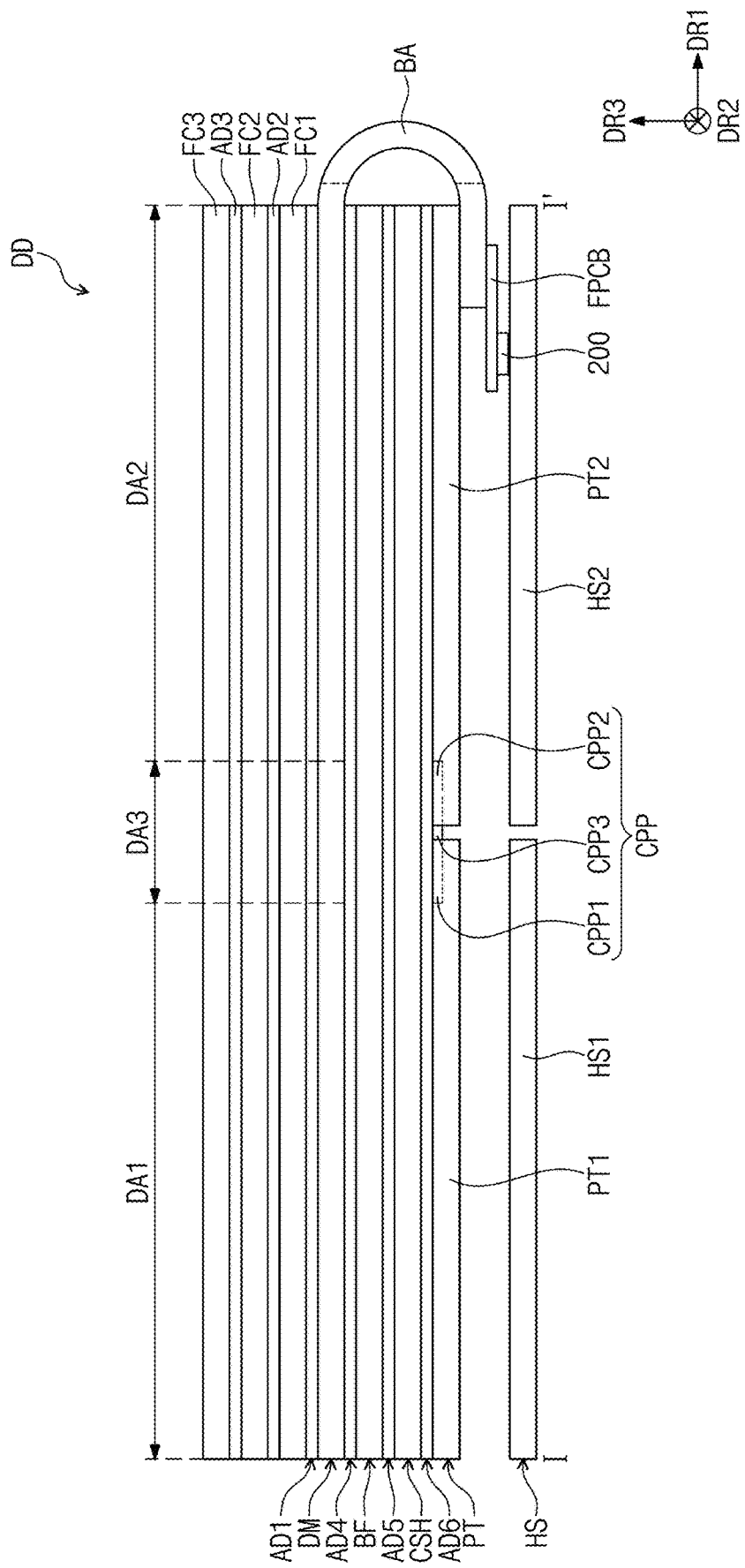
FIG. 9A is a partial cross-sectional view taken along line I-I' of FIG. 1.

An embodiment of the display device DD may include the display module DM, a plurality of function layers FC1 to FC3, a base film BF, a shock absorbing member CSH, a support member PT, a plurality of adhesive members AD1 to AD6, and a crack preventing pattern layer CPP (refer to FIG. 9A). In an alternative embodiment of the invention, a part of components of the display device DD may be omitted if desired. The crack preventing pattern layer CPP will be described later in greater detail with reference to FIGS. 9A to 13.

In an embodiment of the invention, each of the adhesive members AD1 to AD6 may be a pressure sensitive adhesive ("PSA").

The function layers FC1 to FC3 may be disposed over a display module DM.

The first function layer FC1 may be adhered to the display module DM by the first adhesive member AD1. The second function layer FC2 may be adhered to the first function layer FC1 by the second adhesive member AD2. The third function layer FC3 may be adhered to the second function layer FC2 by the third adhesive member AD3.

Each of the function layers FC1 to FC3 may include a polymer material. Each of the function layers FC1 to FC3 may be in a form of a film. A modulus of each of the function layers FC1 to FC3 may be about 2 gigapascal (Gpa) or greater and about 100 Gpa or less.

A thickness of each of the function layers FC1 to FC3 may be about 35 micrometers (μm) or greater and about 60 μm or less. In a case where the thickness of each of the function layers FC1 to FC3 is smaller than about 35 μm, the ability to perform an intended function may decrease; in the case where the thickness of each of the function layers FC1 to FC3 is greater than about 60 μm, flexibility of the display device DD may decrease. In an embodiment of the invention, the first function layer FC1 may be a polarization function layer that polarizes an incident light. The second function layer FC2 may be a shock absorbing function layer that absorbs a shock from an outside. The third function layer FC3 may be a window function layer that forms the exterior of the display device DD. In an alternative embodiment of the invention, a part of the first to third function layers FC1 to FC3 may be selectively omitted.

The base film BF, the shock absorbing member CSH and the support member PT are disposed under the display module DM.

The base film BF may be adhered to the display module DM by the fourth adhesive member AD4. The base film BF may include a polymer material.

The shock absorbing member CSH may be adhered to the base film BF by the fifth adhesive member AD5. The shock absorbing member CSH may include a polymer material. The shock absorbing member CSH may have a predetermined elasticity and may be a layer for absorbing a shock from the outside.

The support member PT may be adhered to the shock absorbing member CSH by the sixth adhesive member AD6. The support member PT may support the display module DM. The support member PT may include a hinge for folding or bending the display module DM. The support member PT may have a rigid characteristic. The support member PT may include a metal.

Referring to FIG. 4A, the display module DM may include a display panel DP and an input sensing circuit ISC. The input sensing circuit ISC may sense a touch and/or pressure that is applied thereon from an outside. The input sensing circuit ISC may sense a variation in a capacitance due to a touch and/or pressure applied thereon from an outside.

The input sensing circuit ISC may be disposed directly on an encapsulation layer (not illustrated) of the display panel DP. Here, the expression "disposed directly on" means that the input sensing circuit ISC is disposed on the display panel DP without a separate adhesive member therebetween.

Referring to FIG. 4B, the display module DM-1 may include the display panel DP, the input sensing circuit ISC, and a seventh adhesive member AD7. The display panel DP and the input sensing circuit ISC may be adhered to each other by the seventh adhesive member AD7.

Figure 5:
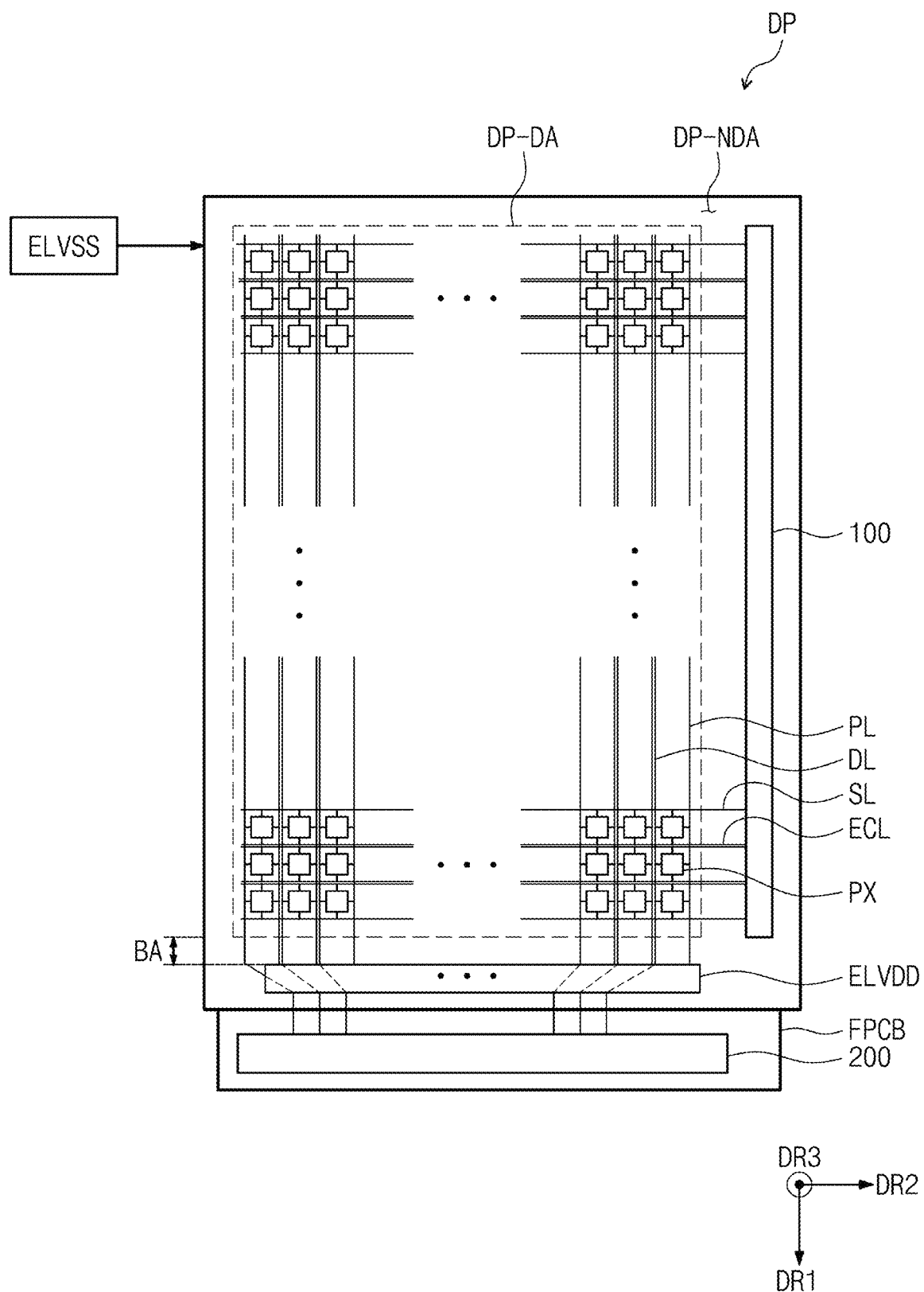
FIG. 5 illustrates a display panel according to an embodiment of the invention.

FIG. 5 illustrates the display panel DP according to an embodiment of the invention.

The display panel DP includes a display area DP-DA and a non-display area DP-NDA in a plan view. In an embodiment, as shown in FIG. 5, the non-display area DD-NDA may be defined along an edge of the display area DP-DA. The display area DP-DA and the non-display area DP-NDA of the display panel DP may correspond to the display area DD-DA and the non-display area DD-NDA of the display device DD illustrated in FIG. 1, respectively.

The display panel DP may include a scan driver 100, a data driver 200, a plurality of scan lines SL, a plurality of light-emitting control lines ECL, a plurality of data lines DL, a plurality of power lines PL, and a plurality of pixels PX. The pixels PX are arranged in the display area DD-DA. Each of the pixels PX includes an organic light-emitting diode OLED (refer to FIG. 6) and a pixel circuit CC (refer to FIG. 6) connected to the organic light-emitting diode OLED.

The scan driver 100 may include a scan driving unit and a light-emitting control driving unit.

The scan driving unit generates scan signals and sequentially outputs the generated scan signals to the scan lines SL.

The light-emitting control driving unit generates light-emitting control signals and sequentially outputs the generated light-emitting control signals to the light-emitting control lines ECL.

In an alternative embodiment of the invention, the scan driving unit and the light-emitting control driving unit may be implemented by a single circuit, not separated within the scan driver 100.

The scan driver 100 may include a plurality of thin film transistors that are provided or formed with a circuit to drive the pixels PX through a same process, for example, a low temperature polycrystalline silicon ("LTPS") process or a low temperature polycrystalline oxide ("LTPO") process.

The data driver 200 outputs data signals to the data lines DL. Analog voltages of the data signals may correspond to grayscale values of image data.

In an embodiment of the invention, the data driver 200 may be mounted on a printed circuit board FPCB, and the printed circuit board FPCB may be connected with pads disposed at first ends of the data lines DL. However, the invention is not limited thereto. In one embodiment, for example, the data driver 200 may be disposed or mounted directly on the display panel DP.

The scan lines SL may extend in the second direction DR2 and may be arranged in the first direction DR1 intersecting the second direction DR2. In an embodiment of the invention, the first direction DR1 may be perpendicular to the second direction DR2, but the invention is not limited thereto.

The light-emitting control lines ECL may extend in the second direction DR2 and may be arranged in the first direction DR1. In an embodiment, each of the light-emitting control lines ECL may be parallel to the corresponding scan line of the scan lines SL.

The data lines DL may extend in the first direction DR1 and may be arranged in the second direction DR2 intersecting the first direction DR1. The data lines DL may provide data signals to corresponding pixels PX.

The power lines PL may extend in the first direction DR1 and may be arranged in the second direction DR2. The power lines PL may provide a first power supply voltage ELVDD to corresponding pixels PX.

Each of the pixels PX is connected to a corresponding scan line of the scan lines SL, a corresponding light-emitting control line of the light-emitting control lines ECL, a corresponding data line of the data lines DL, and a corresponding power line of the power lines PL.

The non-display area DP-NDA of the display panel DP may include a bending area BA. In an embodiment where the display panel DP is bent or folded at the bending area BA, on a plane defined by the first direction DR1 and the second direction DR2, the area of the non-display area DP-NDA may decrease, such that the display device DD may be allowed to have a thin bezel. In such an embodiment, the display device DD in which the area of the non-display area DD-NDA of FIG. 1 is small may be provided.

Figure 6:
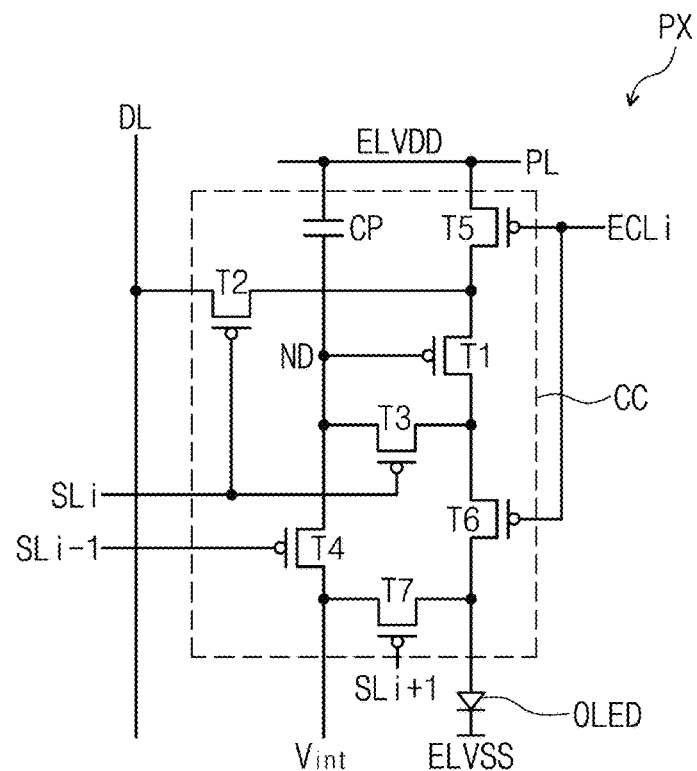
FIG. 6 illustrates an equivalent circuit of a pixel according to an embodiment of the invention.
Figure 7:
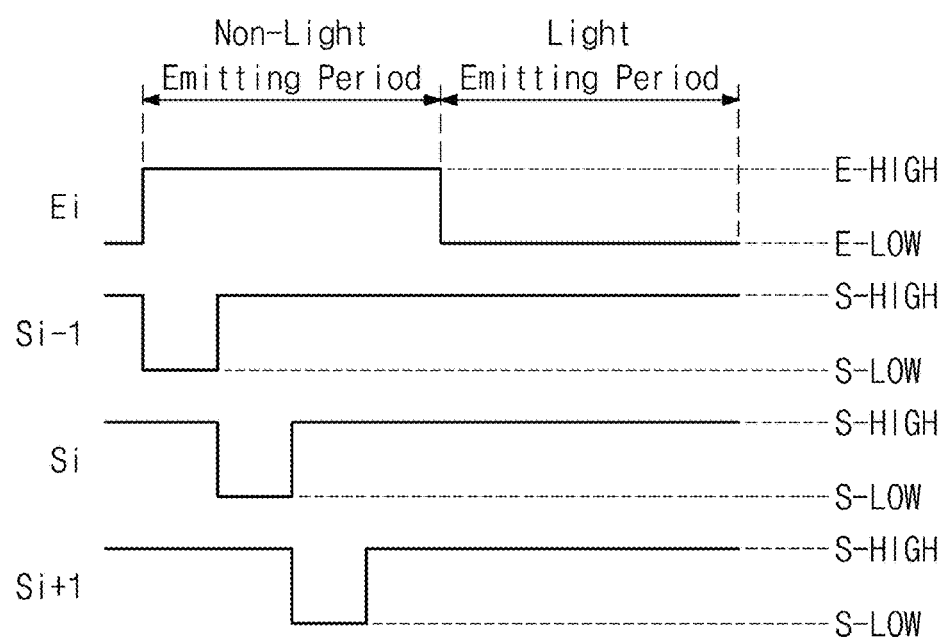
FIG. 7 illustrates a signal timing diagram of a light-emitting control signal and scan signals applied to a pixel of FIG. 6.

FIG. 6 illustrates an equivalent circuit of a pixel PX according to an embodiment of the invention. FIG. 7 illustrates a signal timing diagram of a light-emitting control signal Ei and scan signals Si−1, Si, and Si+1 applied to the pixel PX of FIG. 6. FIG. 6 shows a pixel PX connected to an i-th scan line SLi and an i-th light-emitting control line ECLi.

The pixel PX may include the organic light-emitting element OLED and the pixel circuit CC. The pixel circuit CC may include a plurality of transistors T1 to T7 and a capacitor CP. The pixel circuit CC controls an amount of current flowing to the organic light-emitting element OLED in response to a data signal.

The organic light-emitting element OLED may emit a light with luminance corresponding to the amount of current provided from the pixel circuit CC. In such an embodiment, a level of the first power supply voltage ELVDD may be higher than a level of a second power supply voltage ELVSS.

Each of the plurality of transistors T1 to T7 may include an input electrode (or a source electrode), an output electrode (or a drain electrode), and a control electrode (or a gate electrode). For convenience of description, herein, one of the input electrode and the output electrode may be referred to as a "first electrode", and the other thereof may be referred to as a "second electrode".

The first electrode of the first transistor T1 is connected to the first power supply voltage ELVDD through the fifth transistor T5, and the second electrode thereof is connected to an anode electrode of the organic light-emitting element OLED through the sixth transistor T6. Herein, the first transistor T1 may be referred to as a "driving transistor".

The first transistor T1 controls the amount of current flowing to the organic light-emitting element OLED in response to a voltage applied to the control electrode of the first transistor T1.

The second transistor T2 is connected between the data line DL and the first electrode of the first transistor T1. The control electrode of the second transistor T2 is connected to the i-th scan line SLi. When the i-th scan signal Si is provided to the i-th scan line SLi, the second transistor T2 is turned on and thus electrically connects the data line DL and the first electrode of the first transistor T1.

The third transistor T3 is connected between the second electrode and the control electrode of the first transistor T1. The control electrode of the third transistor T3 is connected to the i-th scan line SLi. When the i-th scan signal Si is provided to the i-th scan line SLi, the third transistor T3 is turned on and thus electrically connects the second electrode and the control electrode of the first transistor T1. In such an embodiment, when the third transistor T3 is turned on, the first transistor T1 may be diode-connected.

The fourth transistor T4 is connected between a node ND and an initialization voltage generator (not illustrated) which outputs an initialization voltage Vint. The control electrode of the fourth transistor T4 is connected to the (i−1)-th scan line SLi−1. The fourth transistor T4 is turned on when the (i−1)-th scan signal Si−1 is provided to the (i−1)-th scan line SLi−1 and thus provides the initialization voltage Vint to the node ND.

The fifth transistor T5 is connected between the power line PL and the first electrode of the first transistor T1. The control electrode of the fifth transistor T5 is connected to the i-th light-emitting control line ECLi.

The sixth transistor T6 is connected between the second electrode of the first transistor T1 and the anode electrode of the organic light-emitting element OLED. The control electrode of the sixth transistor T6 is connected to the i-th light-emitting control line ECLi.

The seventh transistor T7 is connected between the initialization voltage generator (not illustrated) and the anode electrode of the organic light-emitting element OLED. The control electrode of the seventh transistor T7 is connected to the (i+1)-th scan line SLi+1. In such an embodiment, the seventh transistor T7 is turned on when the (i+1)-th scan signal Si+1 is provided to the (i+1)-th scan line SLi+1 and thus provides the initialization voltage Vint to the anode electrode of the organic light-emitting element OLED.

The seventh transistor T7 may improve the black expression ability of the pixel PX. In such an embodiment, when the seventh transistor T7 is turned on, a parasitic capacitor (not illustrated) of the organic light-emitting element OLED is discharged. In such an embodiment, light emission from the organic light-emitting element OLED due a leakage current from the first transistor T1 may be effectively prevented when implementing black luminance, thus improving the black expression ability.

In an embodiment, as illustrated in FIG. 6, the control electrode of the seventh transistor T7 may be connected to the (i+1)-th scan line SLi+1, but the invention is not limited thereto. In an alternative embodiment of the invention, the control electrode of the seventh transistor T7 may be connected to the i-th scan line SLi or the (i−1)-th scan line SLi−1.

In an embodiment, as shown in FIG. 6, the transistors may be p-type metal-oxide-semiconductor ("PMOS") transistors, but the invention is not limited thereto. In an alternative embodiment of the invention, the pixel PX may be implemented with n-type metal-oxide-semiconductor ("NMOS") transistors. In another alternative embodiment of the invention, the pixel PX may be implemented with a combination of PMOS transistor and NMOS transistors.

The capacitor CP is interposed between the power line PL and the node ND. The capacitor CP stores a voltage corresponding to a data signal. When the fifth transistor T5 and the sixth transistor T6 are turned on according to the voltage stored in the capacitor CP, the amount of current flowing to the first transistor T1 may be determined.

In embodiments of the invention, a structure of the pixel PX is not limited to the structure illustrated in FIG. 6. In embodiments of the invention, the structure of the pixel PX may be variously modified to allow the organic light-emitting element OLED to emit a light.

Referring to FIG. 7, the light-emitting control signal Ei may have a high level E-HIGH or a low level E-LOW. Each of the scan signals Si−1, Si, and Si+1 may have a high level S-HIGH or a low level S-LOW.

When the light-emitting control signal Ei is at the high level E-HIGH, the fifth transistor T5 and the sixth transistor T6 are turned off. When the fifth transistor T5 is turned off, the power line PL and the first electrode of the first transistor T1 are electrically disconnected. When the sixth transistor T6 is turned off, the second electrode of the first transistor T1 and the anode electrode of the organic light-emitting element OLED are electrically disconnected. Accordingly, the organic light-emitting element OLED does not emit a light during a period where the light-emitting control signal Ei provided to the i-th light-emitting control line ECLi is in the high level E-HIGH.

Afterwards, the fourth transistor T4 is turned on when the (i−1)-th scan signal Si−1 provided to the (i−1)-th scan line SLi−1 is at the low level S-LOW. When the fourth transistor T4 is turned on, the initialization voltage Vint is provided to the node ND.

The second transistor T2 and the third transistor T3 are turned on when the i-th scan signal Si provided to the i-th scan line SLi is at the low level S-LOW.

When the second transistor T2 is turned on, a data signal is provided to the first electrode of the first transistor T1. In this case, because the node ND is initialized to the initialization voltage Vint, the first transistor T1 is turned on. When the first transistor T1 is turned on, a voltage corresponding to the data signal is provided to the node ND. In this case, the capacitor CP stores the voltage corresponding to the data signal.

The seventh transistor T7 is turned on when the (i+1)-th scan signal Si+1 provided to the (i+1)-th scan line SLi+1 is at the low level S-LOW.

When the seventh transistor T7 is turned on, the initialization voltage Vint is provided to the anode electrode of the organic light-emitting element OLED, and a parasitic capacitor of the organic light-emitting element OLED is discharged.

The fifth transistor T5 and the sixth transistor T6 are turned on when the light-emitting control signal Ei provided to the light-emitting control line ECLi is at the low level E-LOW. When the fifth transistor T5 is turned on, the first power supply voltage ELVDD is provided to the first electrode of the first transistor T1. When the sixth transistor T6 is turned on, the second electrode of the first transistor T1 and the anode electrode of the organic light-emitting element OLED are electrically connected. As such, the organic light-emitting element OLED generates a light of luminance corresponding to the amount of the provided current.

Figure 8:
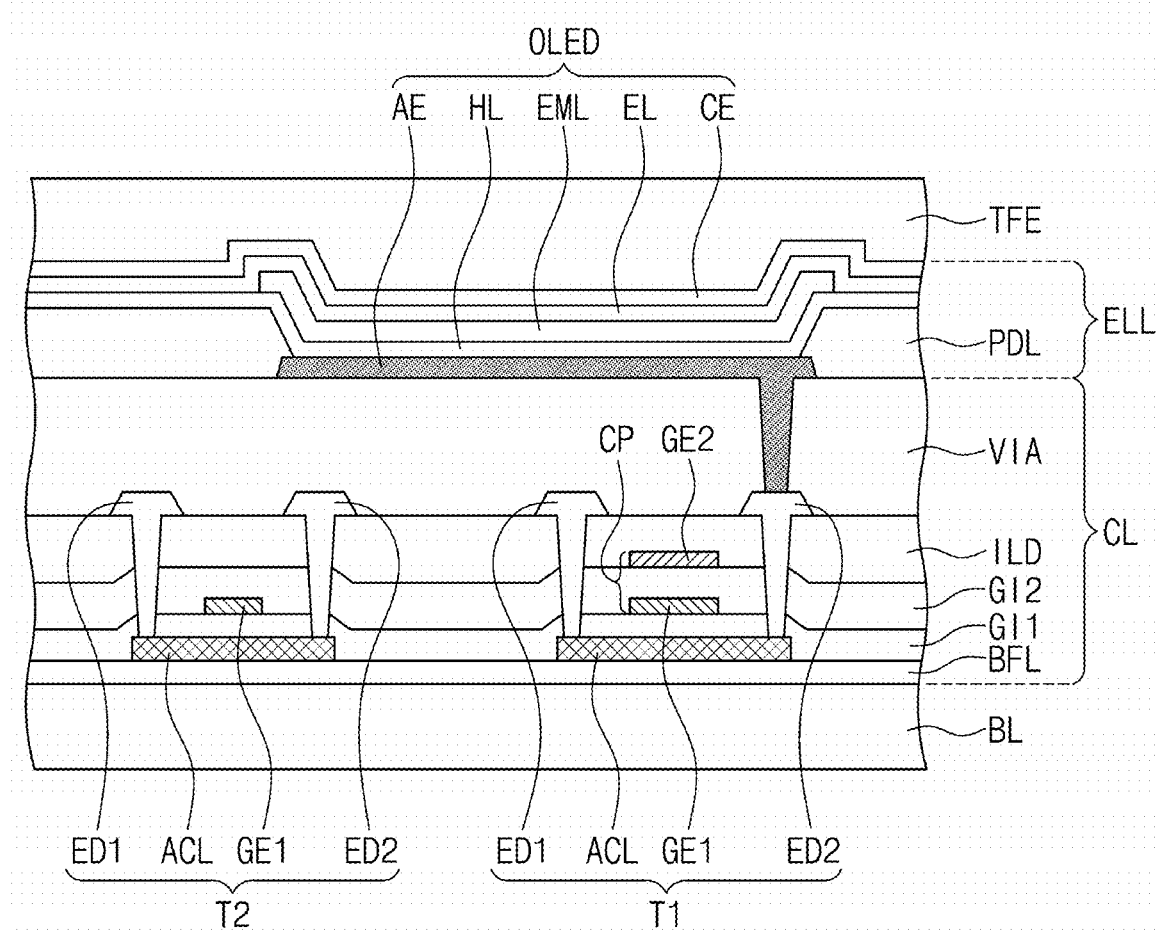
FIG. 8 is a cross-sectional view of a portion of a pixel according to an embodiment of the invention.

FIG. 8 is a cross-sectional view of a portion of a pixel PX (refer to FIG. 6) according to an embodiment of the invention.

The first transistor T1 and the second transistor T2 illustrated in FIG. 8 are merely exemplary, and a structure of the first transistor T1 and the second transistor T2 is not limited thereto. In one embodiment, as illustrated in FIG. 8, a second electrode ED2 of the first transistor T1 directly contacts an anode electrode AE of the pixel PX in terms of a cross-sectional view. In such an embodiment, as illustrated in FIG. 6, the first transistor T1 may be connected with the anode electrode AE of the pixel PX through the sixth transistor T6. However, the invention is not limited thereto. In an alternative embodiment of the invention, the second electrode ED2 of the first transistor T1 may directly contact the anode electrode AE of the pixel PX.

The display panel DP (refer to FIG. 5) may include a base layer BL, a circuit layer CL, a light-emitting element layer ELL, and an encapsulation layer TFE.

The circuit layer CL may include a buffer layer BFL, gate insulating layers GI1 and GI2, an interlayer insulating layer ILD, a circuit insulating layer VIA, and the transistors T1 and T2.

The light-emitting element layer ELL may include the organic light-emitting element OLED and a pixel defining layer PDL.

The encapsulation layer TFE may encapsulate the light-emitting element layer ELL to protect the light-emitting element layer ELL from external oxygen or moisture.

The buffer layer BFL is disposed on a surface (e.g., an upper surface) of the base layer BL.

The buffer layer BFL effectively prevents impurities present in the base layer BL from being introduced into the pixel PX during a manufacturing process. In such an embodiment, the buffer layer BFL effectively prevents impurities from being diffused into active layers ACL of the transistors T1 and T2.

The impurities may be introduced from an outside or may be generated due to the pyrolysis of the base layer BL. The impurities may be natrium or gas exhausted from the base layer BL. In an embodiment, the buffer layer BFL blocks moisture that is introduced into the pixel PX from an outside.

The active layers ACL of the respective transistors T1 and T2 are disposed on the buffer layer BFL. Each of the active layers ACL may include a polysilicon or an amorphous silicon. Alternative, the active layers ACL may include a metal oxide semiconductor.

Each of the active layers ACL may include a channel area used as a path capable of transferring electrons or holes, and a first ion doping area and a second ion doping area, and the channel area may be defined between the first ion doping area and the second ion doping area, A first gate insulating layer GI1 covering the active layers ACL is disposed on the buffer layer BFL. The first gate insulating layer GI1 includes an organic film and/or an inorganic film. The first gate insulating layer GI1 may include a plurality of inorganic thin films. The plurality of inorganic thin films may include a silicon nitride layer or a silicon oxide layer.

Control electrodes GE1 of the respective transistors T1 and T2 are disposed on the first gate insulating layer GI1. The control electrode GE1 of the first transistor T1 may define one of two electrodes of the capacitor CP. At least a portion of the scan lines SL (refer to FIG. 5) and the light-emitting control lines ECL (refer to FIG. 5) may be disposed on the first gate insulating layer GI1.

A second gate insulating layer GI2 covering the control electrodes GE1 is disposed on the first gate insulating layer GI1. The second gate insulating layer GI2 includes an organic film and/or an inorganic film. The second gate insulating layer GI2 may include a plurality of inorganic thin films. The plurality of inorganic thin films may include a silicon nitride layer or a silicon oxide layer.

The other electrode GE2 of the two electrodes of the capacitor CP (refer to FIG. 6) may be disposed on the second gate insulating layer GI2. In an embodiment, the control electrode GE1 disposed on the first gate insulating layer GI1 and the electrode GE2 disposed on the second gate insulating layer GI2 may overlap each other to form the capacitor CP, as illustrated in FIG. 6. However, a structure in which electrodes of the capacitor CP are disposed is not limited thereto.

An interlayer insulating layer ILD covering the electrode GE2 is disposed on the second gate insulating layer GI2. The interlayer insulating layer ILD includes an organic film and/or an inorganic film. The interlayer insulating layer ILD may include a plurality of inorganic thin films. The plurality of inorganic thin films may include a silicon nitride layer or a silicon oxide layer.

At least a portion of the data line DL (refer to FIG. 5) and the power line PL (refer to FIG. 5) may be disposed on the interlayer insulating layer ILD. The first and second electrodes ED1 and ED2 of the transistors T1 and T2 may be disposed on the interlayer insulating layer ILD.

The first electrodes ED1 and the second electrodes ED2 may be connected with the corresponding active layers ACL via through holes defined through the gate insulating layers GI1 and GI2 and the interlayer insulating layer ILD.

The circuit insulating layer VIA covering the first electrodes ED1 and the second electrodes ED2 is disposed on the interlayer insulating layer ILD. The circuit insulating layer VIA includes an organic film and/or an inorganic film. The circuit insulating layer VIA may provide a planarization surface.

The pixel defining layer PDL and the organic light-emitting element OLED are disposed on the circuit insulating layer VIA.

The organic light-emitting element OLED may include an anode electrode AE, a hole control layer HL, a light emitting layer EML, an electron control layer EL, and a cathode electrode CE.

Figure 9B:
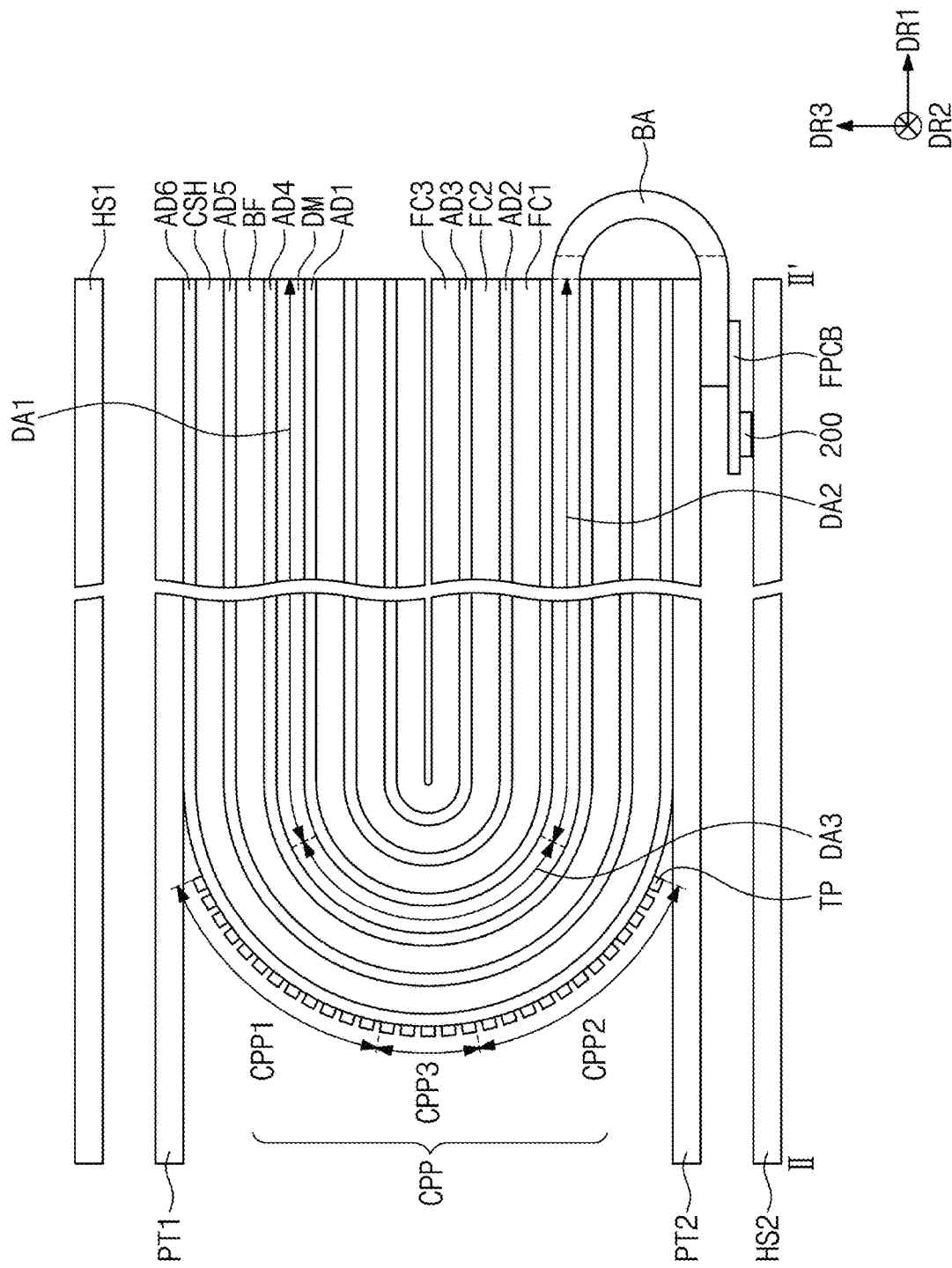
FIG. 9B is a partial cross-sectional view taken along line II-IF of FIG. 2.
Figure 9C:
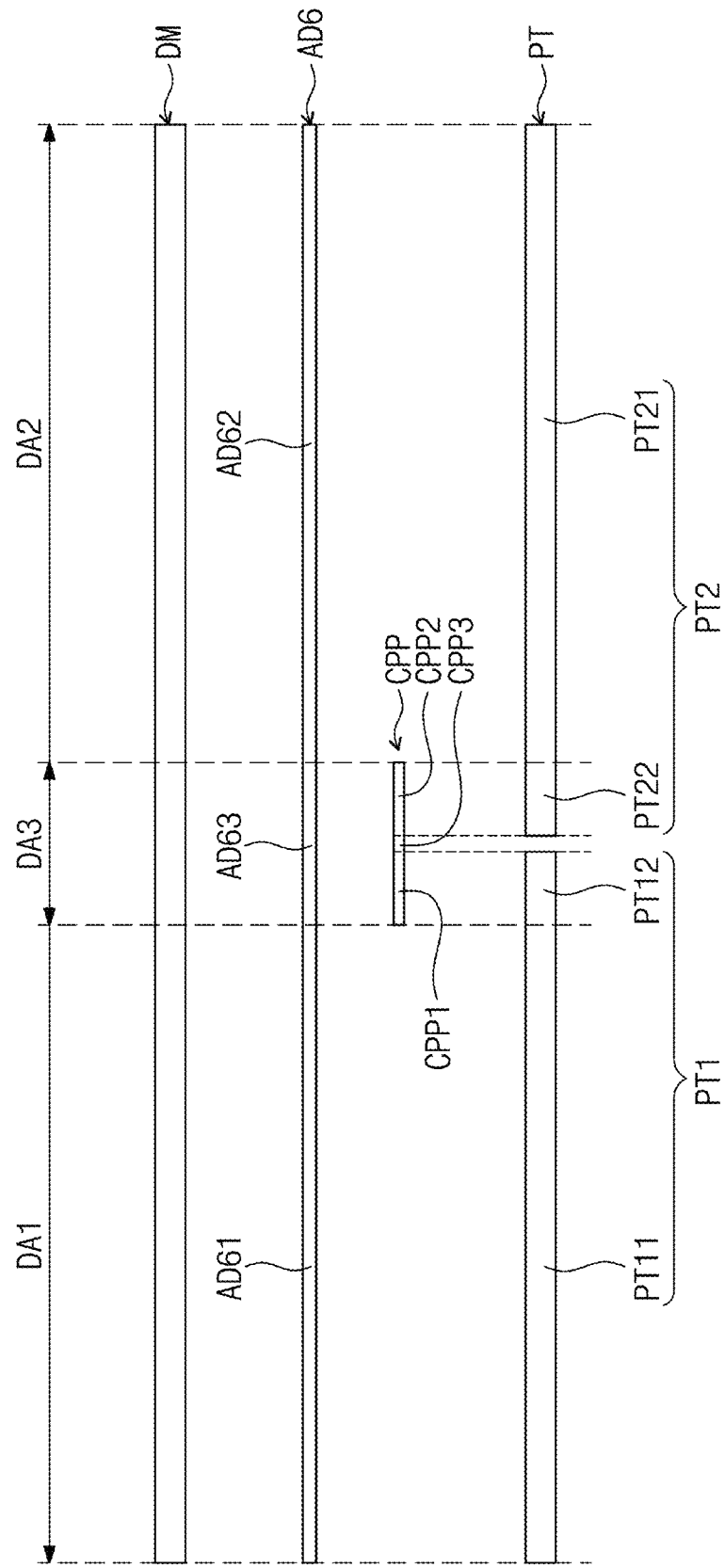
FIG. 9C is an exploded perspective view of only a part of components illustrated in FIG. 9A.

FIG. 9A is a partial cross-sectional view taken along line I-I' of FIG. 1. FIG. 9B is a partial cross-sectional view taken along line II-II' of FIG. 2A. More particularly, FIG. 9B illustrates the appearance that the display device DD of FIG. 9A is folded. FIG. 9C is an exploded perspective view of only a part of components illustrated in FIG. 9A. More particularly, FIG. 9C is an exploded perspective view of the display module DM, the sixth adhesive member AD6, the crack preventing pattern layer CPP, and the support member PT of the components illustrated in FIG. 9A.

The display module DM may include a first display area DA1, a second display area DA2, and a third display area DA3. The third display area DA3 may be interposed between the first display area DA1 and the second display area DA2. The third display area DA3 may be an area that overlaps the bending axis BX (refer to FIG. 2A).

The support member PT may include a first support member PT1 and a second support member PT2.

The first support member PT1 may overlap the first display area DA1 and the third display area DA3 in the third direction DR3. The first support member PT1 may not overlap the second display area DA2 in the third direction DR3.

The second support member PT2 may overlap the second display area DA2 and the third display area DA3 in the third direction DR3. The second support member PT2 may not overlap the first display area DA1 in the third direction DR3.

The first support member PT1 may be spaced from the second support member PT2 with a predetermined distance in the first direction DR1.

In an embodiment of the invention, the bending axis BX (refer to FIG. 2A) may be defined by a boundary area between the first support member PT1 and the second support member PT2. In an embodiment of the invention, the bending axis BX (refer to FIG. 2A) may be defined as an axis that overlaps the boundary area between the first support member PT1 and the second support member PT2 in the third direction DR3.

The crack preventing pattern layer CPP may be interposed between the sixth adhesive member AD6 and the support member PT. The crack preventing pattern layer CPP may be attached on a surface of a portion of the sixth adhesive member AD6, which overlaps the third display area DA3.

The crack preventing pattern layer CPP may include a plurality of crack preventing members TP. The crack preventing pattern layer CPP may be divided into a first crack preventing pattern CPP1, a second crack preventing pattern CPP2, and a third crack preventing pattern CPP3. The third crack preventing pattern CPP3 may be interposed between the first crack preventing pattern CPP1 and the second crack preventing pattern CPP2. The third crack preventing pattern CPP3 may extend from the first crack preventing pattern CPP1, and the second crack preventing pattern CPP2 may extend from the third crack preventing pattern CPP3.

The first crack preventing pattern CPP1 may overlap the first support member PT1, and the second crack preventing pattern CPP2 may overlap the second support member PT2.

The third crack preventing pattern CPP3 may be exposed through a separation space between the first support member PT1 and the second support member PT2.

In an embodiment of the invention, the housing HS may include a first housing HS1 overlapping the first display area DA1 and a second housing HS2 overlapping the second display area DA2. Although not illustrated in drawings, a hinge (not shown) for folding the display device DD may be interposed between the first housing HS1 and the second housing HS2.

When the bending area BA of the display module DM is bent, at least a portion of the display module DM, at least a portion of the printed circuit board FPCB, and the data driver 200 may be interposed between the support member PT and the housing HS.

Referring to FIG. 9B, a portion of the first support member PT1, which is adjacent to the bending axis BX (refer to FIG. 2A), and a portion of the second support member PT2, which is adjacent to the bending axis BX (refer to FIG. 2A), may not be adhered to the sixth adhesive member AD6. In such an embodiment, when the display device DD is folded with respect to the bending axis BX (refer to FIG. 2A), an issue due to a rigid property of each of the first support member PT1 and the second support member PT2 may be solved.

Herein, a state where the display device DD is not folded as illustrated in FIG. 9A may be referred to a "first mode", and a state where the display device DD is folded as illustrated in FIG. 9B may be referred to a "second mode".

In an embodiment of the invention, when the display device DD is in the first mode, the crack preventing pattern layer CPP may be in contact with the support member PT. When the display device DD is in the second mode, the crack preventing pattern layer CPP may be spaced from the support member PT.

In an embodiment of the invention, the first area by which the crack preventing pattern layer CPP contacts the support member PT when the display device DD is in the first mode may be greater than the second area by which the crack preventing pattern layer CPP contacts the support member PT when the display device DD is in the second mode.

Referring to FIG. 9C, the sixth adhesive member AD6 may include a first adhesive part AD61 overlapping the first display area DA1, a second adhesive part AD62 overlapping the second display area DA2, and a third adhesive part AD63 overlapping the third display area DA3.

The first support member PT1 may include a first portion PT11 overlapping the first adhesive part AD61 and a second portion PT12 overlapping the third adhesive part AD63. The first portion PT11 of the first support member PT1 may be attached to the first adhesive part AD61. The second portion PT12 of the first support member PT1 may not be attached to the third adhesive part AD63 by the crack preventing pattern layer CPP.

The second support member PT2 may include a first portion PT21 overlapping the second adhesive part AD62 and a second portion PT22 overlapping the third adhesive part AD63. The first portion PT21 of the second support member PT2 may be attached to the second adhesive part AD62. The second portion PT22 of the second support member PT2 may not be attached to the third adhesive part AD63 by the crack preventing pattern layer CPP.

FIGS. 10, 11, 12, and 13 illustrate layouts of crack preventing members TP, TP-1, TP-2, and TP-3 according to an embodiment of the invention.

Figure 10:
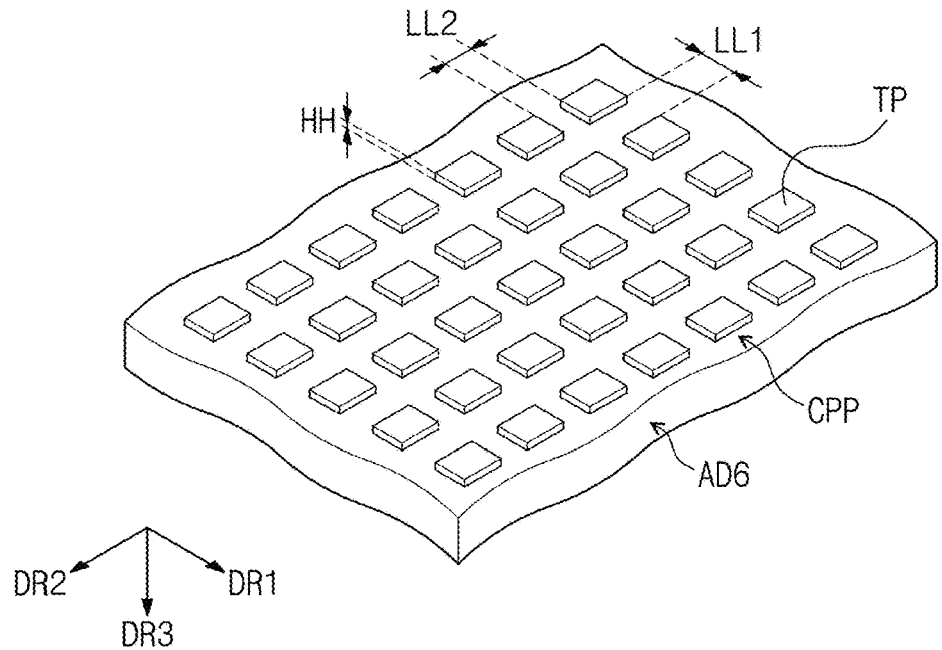
FIGS. 10, 11, 12, and 13 illustrate layouts of crack preventing members according to an embodiment of the invention.

Referring to FIG. 10, the crack preventing pattern layer CPP including crack preventing members TP may be disposed on a surface of the sixth adhesive member AD6.

The crack preventing members TP may be arranged on the surface of the sixth adhesive member AD6 in a form of a matrix. Each of the crack preventing members TP may have a rectangular shape, when viewed from a plan view in the third direction DR3.

The crack preventing members TP may be formed or disposed on the surface of the sixth adhesive member AD6 by a deposition process or a transfer process.

In an embodiment of the invention, each of the crack preventing members TP may have a thickness HH in a range of about 0.5 micrometer (μm) to about 2 μm. In a case where the thickness HH of the crack preventing member TP is less than about 0.5 μm, a process may be difficult, and durability of the crack preventing member TP may not be sufficiently high such that the crack preventing member TP is easily damaged. In a case where the thickness HH of the crack preventing member TP is greater than about 2 μm, a three-dimensional shape of the crack preventing member TP may be visible or recognized by a user such that the aesthetic appeal of the display device DD may be lowered.

In an embodiment of the invention, a separation distance LL1 (hereinafter referred to as a "first separation distance") between two adjacent crack preventing members TP in the first direction DR1 from among the crack preventing members TP may be in a range of about 0.5 millimeter (mm) to about 1 mm.

In an embodiment of the invention, a separation distance LL2 (hereinafter referred to as a "second separation distance") between two adjacent crack preventing members TP in the second direction DR2 from among the crack preventing members TP may be in a range of about 0.5 mm to about 1 mm.

In a case where each of the first separation distance LL1 and the second separation distance LL2 is less than about 0.5 mm, when the display module DM is folded, a stress may be applied to the sixth adhesive member AD6 by the crack preventing members TP.

In a case where each of the first separation distance LL1 and the second separation distance LL2 is greater than about 1 mm, a foreign substance may be attached to the sixth adhesive member AD6 through spaces between the crack preventing members TP, thereby the durability of the display device DD may be impaired and the aesthetic appeal of the display device DD may be lowered.

Figure 11:
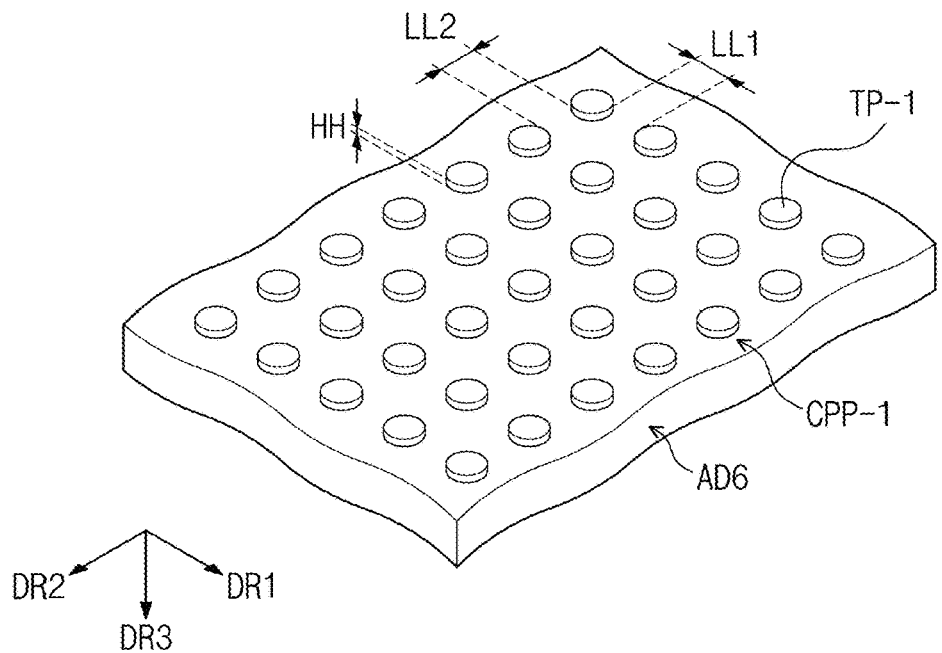

Referring to FIG. 11, in an alternative embodiment, a crack preventing pattern layer CPP-1 including crack preventing members TP-1 may be disposed on a surface of the sixth adhesive member AD6.

The crack preventing members TP-1 may be arranged on the surface of the sixth adhesive member AD6 in a form of a matrix. Each of the crack preventing members TP-1 may have a circular shape, when viewed from a plan view in the third direction DR3.

The thickness HH, the first separation distance LL1, and the second separation distance LL2 of each of the crack preventing members TP-1 are the same as those described with reference to FIG. 10, and thus, any repetitive detailed description thereof will be omitted.

Figure 12:
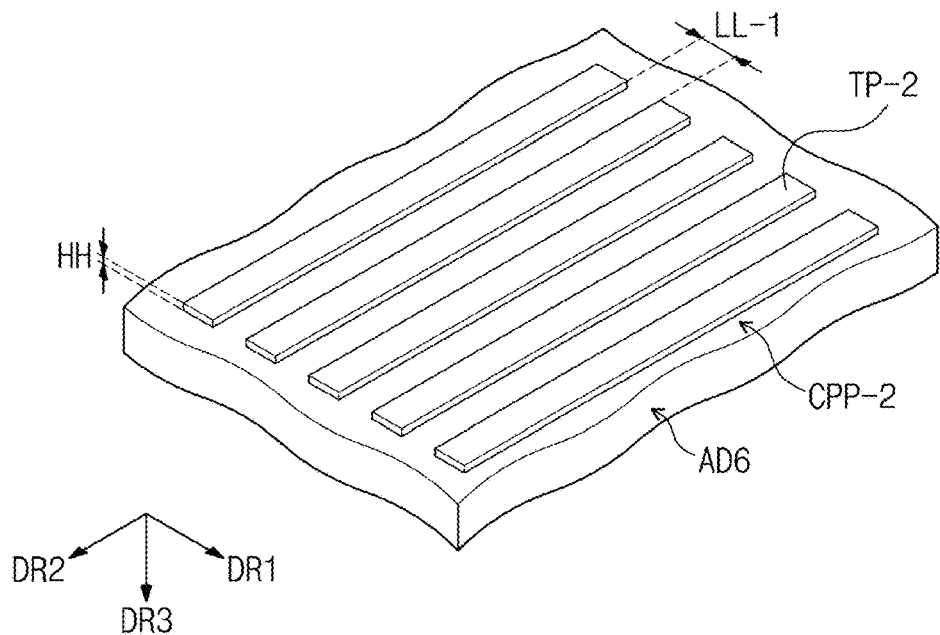

Referring to FIG. 12, in another alternative embodiment, a crack preventing pattern layer CPP-2 including crack preventing members TP-2 may be disposed on a surface of the sixth adhesive member AD6.

The crack preventing members TP2 may be arranged in the first direction DR1, and each of the crack preventing members TP-2 may extend in the second direction DR2.

In such an embodiment, a separation distance LL-1 between two adjacent crack preventing members TP-2 in the first direction DR1 from among the crack preventing members TP-2 is substantially the same as the first separation distance LL1 described above with reference to FIG. 10. In such an embodiment, the thickness HH of each of the crack preventing members TP-2 is substantially the same as the thickness HH described above with reference to FIG. 10.

Figure 13:
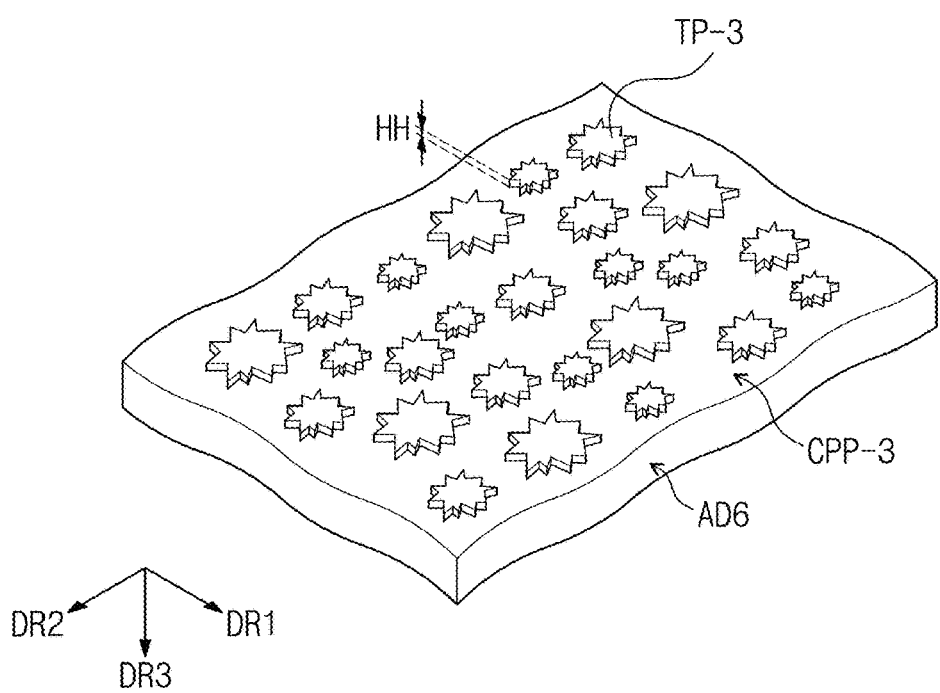

Referring to FIG. 13, in another alternative embodiment, a crack preventing pattern layer CPP-3 including crack preventing members TP-3 may be disposed on a surface of the sixth adhesive member AD6.

The crack preventing members TP-3 may have areas or sizes different from each other, when viewed a plan view in the third direction DR3.

Unlike the crack preventing members TP and TP-1 illustrated in FIGS. 11 and 12, the crack preventing members TP-3 illustrated in FIG. 13 may be arranged randomly, not in a form of a matrix.

A separation distance between adjacent crack preventing members TP-3 from among the crack preventing members TP-3 may be about 0.5 mm or greater and about 1 mm or less, which is determined based on the reasons stated above with respect to the first separation distance LL1 and the second separation distance LL2.

According to an embodiment of the invention, a foreign substance may be effectively prevented from being attached to a surface of an adhesive member of a display device.

According to an embodiment of the invention, a stress due to the folding may decrease by securing flexibility of a folding portion of the display device.

In such an embodiment, the display device with high durability and improved aesthetic appeal may be provided.

While the invention has been described with reference to exemplary embodiments thereof, it will be apparent to those of ordinary skill in the art that various changes and modifications may be made thereto without departing from the spirit and scope of the invention as set forth in the following claims.

What is claimed is:
1. A display device comprising:
a display module in which a first display area, a second display area, and a third display area interposed between the first display area and the second display area are defined, wherein the display module is foldable with respect to a bending axis overlapping the third display area;
an adhesive member disposed under the display module and overlapping the first display area, the second display area and the third display area;
a first support member overlapping the first display area and disposed under the adhesive member, wherein a portion of the first support member is in contact with the adhesive member;
a second support member overlapping the second display area, disposed under the adhesive member, and spaced from the first support member with a predetermined distance, wherein a portion of the second support member is in contact with the adhesive member; and
a crack preventing pattern layer overlapping the third display area and disposed under the adhesive member, wherein the crack preventing pattern layer includes a plurality of crack preventing members,
wherein each of the crack preventing members includes a metal or an inorganic material and is in contact with the adhesive member,
wherein a first portion of the crack preventing pattern layer is interposed between the first support member and the adhesive member, and
wherein a second portion of the crack preventing layer is interposed between the second support member and the adhesive member.
2. The display device of claim 1, wherein a thickness of each of the crack preventing members is in a range of about 0.5 μm to about 2 μm.

3. The display device of claim 2, wherein
a separation distance between a first crack preventing member and a second crack preventing member of the crack preventing members is in a range of about 0.5 mm to about 1 mm, and
the second crack preventing member is adjacent to the first crack preventing member.

4. The display device of claim 1, wherein
a third portion of the crack preventing pattern layer is interposed between the first portion and the second portion, and
the third portion is exposed by a separation space between the first support member and the second support member.

5. The display device of claim 1, wherein the plurality of crack preventing members is arranged in a form of a matrix.

6. The display device of claim 1, wherein each of the plurality of crack preventing members extends in a direction parallel to a direction in which the bending axis extends.

7. The display device of claim 1, wherein
when the display device is in a first mode where the display module is not folded, the crack preventing pattern layer is in contact with the first support member and the second support member, and
when the display device is in a second mode where the display module is folded with respect to the bending axis, the crack preventing pattern layer is spaced from the first support member and the second support member.

8. The display device of claim 1, wherein a first area by which the crack preventing pattern layer is in contact with the first support member and the second support member in a first mode where the display module is not folded is greater than a second area by which the crack preventing pattern layer is in contact with the first support member and the second support member in a second mode where the display module is folded with respect to the bending axis.

9. The display device of claim 1, wherein
the first support member overlaps a first portion of the third display area and does not overlap the second display area, and
the second support member overlaps a second portion of the third display area and does not overlap the first display area.

10. The display device of claim 1, wherein the display module includes:
a display panel including a plurality of light-emitting elements and an encapsulation layer which encapsulates the plurality of light-emitting elements; and
an input sensing circuit disposed on the display panel, wherein the input sensing circuit senses a variation in a capacitance by an object approaching from an outside.

11. The display device of claim 10, wherein the input sensing circuit is directly disposed on the encapsulation layer of the display panel.

12. The display device of claim 1, further comprising:
a printed circuit board electrically connected to the display module; and
a driving circuit disposed on the printed circuit board,
wherein a portion of the display module is bent and at least a portion of the display module, at least a portion of the printed circuit board and the driving circuit are disposed under the first support member or the second support member.

13. The display device of claim 1, further comprising:
a shock absorbing member interposed between the display module and the first support member and between the display module and the second support member and having a predetermined elasticity.

14. A display device comprising:
a display module in which a first display area, a second display area, and a third display area interposed between the first display area and the second display area are defined, wherein the display module is foldable with respect to a bending axis overlapping the third display area;
an adhesive member disposed under the display module and including a first adhesive part, a second adhesive part, and a third adhesive part interposed between the first adhesive part and the second adhesive part;
a first support member overlapping the first display area and disposed under the adhesive member, wherein a first portion of the first support member is in contact with the first adhesive part;
a second support member overlapping the second display area and disposed under the adhesive member, wherein a first portion of the second support member is in contact with the second adhesive part; and
a crack preventing pattern layer overlapping the third display area and disposed under the adhesive member,
wherein the crack preventing pattern layer includes a plurality of crack preventing members, and each of the crack preventing members includes a metal or an inorganic material and is in contact with the third adhesive part,
wherein a first portion of the crack preventing pattern layer is interposed between a second portion of the first support member and the adhesive member, and
wherein a second portion of the crack preventing pattern layer is interposed between a second portion of the second support member and the adhesive member.

15. The display device of claim 14, wherein the second portion of the first support member and the second portion of the second support member are not in contact with the adhesive member.

16. The display device of claim 14, wherein a thickness of each of the crack preventing members is in a range of about 0.5 μm to about 2 μm.

17. The display device of claim 16, wherein
a separation distance between a first crack preventing member and a second crack preventing member of the crack preventing members is in a range of about 0.5 mm to about 1 mm, and
wherein the second crack preventing member is adjacent to the first crack preventing member.

18. The display device of claim 14, wherein at least a portion of the crack preventing pattern layer is exposed by a separation space between the first support member and the second support member.

* * * * *